(12) United States Patent
Whetsel

(10) Patent No.: US 10,324,125 B2
(45) Date of Patent: Jun. 18, 2019

(54) TSV TESTING METHOD AND APPARATUS

(71) Applicant: TEXAS INSTRUMENTS INCORPORATED, Dallas, TX (US)

(72) Inventor: Lee D. Whetsel, Parker, TX (US)

(73) Assignee: Texas Instruments Incorporated, Dallas, TX (US)

(*) Notice: Subject to any disclaimer, the term of this patent is extended or adjusted under 35 U.S.C. 154(b) by 64 days.

(21) Appl. No.: 15/790,597

(22) Filed: Oct. 23, 2017

(65) Prior Publication Data
US 2018/0045776 A1    Feb. 15, 2018

Related U.S. Application Data

(62) Division of application No. 15/151,008, filed on May 10, 2016, now Pat. No. 9,835,678, which is a division of application No. 14/734,682, filed on Jun. 9, 2015, now Pat. No. 9,362,188, which is a division of application No. 13/649,808, filed on Oct. 11, 2012, now Pat. No. 9,081,064.

(60) Provisional application No. 61/577,384, filed on Dec. 19, 2011, provisional application No. 61/548,503, filed on Oct. 18, 2011.

(51) Int. Cl.
| | | |
|---|---|---|
| G01R 31/28 | (2006.01) | |
| H01L 23/522 | (2006.01) | |
| G01R 31/3185 | (2006.01) | |
| H01L 21/66 | (2006.01) | |
| H01L 23/538 | (2006.01) | |
| H01L 23/48 | (2006.01) | |

(52) U.S. Cl.
CPC ..... *G01R 31/2853* (2013.01); *G01R 31/2884* (2013.01); *G01R 31/318541* (2013.01); *H01L 22/34* (2013.01); *H01L 23/5226* (2013.01); *H01L 23/5384* (2013.01); *H01L 23/481* (2013.01); *H01L 2224/16146* (2013.01)

(58) Field of Classification Search
None
See application file for complete search history.

(56) References Cited

U.S. PATENT DOCUMENTS

| | | | |
|---|---|---|---|
| 6,894,308 B2 | 5/2005 | Whetsel et al. | |
| 8,344,749 B2 | 1/2013 | Stillman et al. | |
| 8,615,694 B2 | 12/2013 | Whetsel | |
| 8,809,073 B2 | 8/2014 | Yen et al. | |
| 9,081,064 B2 | 7/2015 | Whetsel | |
| 9,362,188 B2 | 6/2016 | Whetsel | |
| 9,559,025 B2 | 1/2017 | Whetsel | |
| 2011/0080184 A1* | 4/2011 | Wu | G01R 31/2853 324/750.3 |

(Continued)

*Primary Examiner* — Jermele M Hollington
(74) *Attorney, Agent, or Firm* — Lawrence J. Bassuk; Charles A. Brill; Frank D. Cimino

(57) ABSTRACT

An integrated circuit die includes a substrate of semiconductor material having a top surface, a bottom surface, and an opening through the substrate between the top surface and the bottom surface. A through silicon via (TSV) has a conductive body in the opening, has a top contact point coupled to the body at the top surface, and has a bottom contact point coupled to the body at the bottom surface. A scan cell has a serial input, a serial output, control inputs, a voltage reference input, a response input coupled to one of the contact points, and a stimulus output coupled to the other one of the contact points.

8 Claims, 17 Drawing Sheets

(56) References Cited

U.S. PATENT DOCUMENTS

| | | |
|---|---|---|
| 2011/0102006 A1 | 5/2011 | Choi et al. |
| 2011/0202804 A1* | 8/2011 | Sunter ............ G01R 31/318577 714/726 |
| 2012/0204073 A1* | 8/2012 | Whetsel ......... G01R 31/318536 714/727 |
| 2013/0057312 A1 | 3/2013 | Pagani |
| 2013/0153896 A1 | 6/2013 | Whetsel |
| 2013/0196458 A1 | 8/2013 | Lin et al. |
| 2013/0230932 A1 | 9/2013 | Bringivijayaraghavan et al. |
| 2014/0070838 A1 | 3/2014 | Vukic et al. |
| 2017/0103931 A1 | 4/2017 | Whetsel |
| 2017/0343603 A1* | 11/2017 | Chakrabarty .......... G01R 31/44 |

* cited by examiner

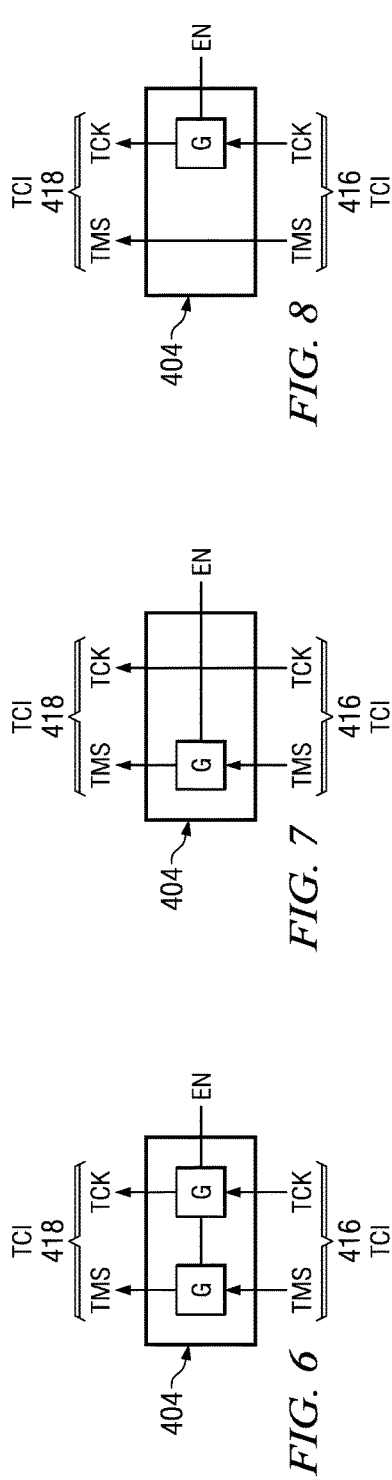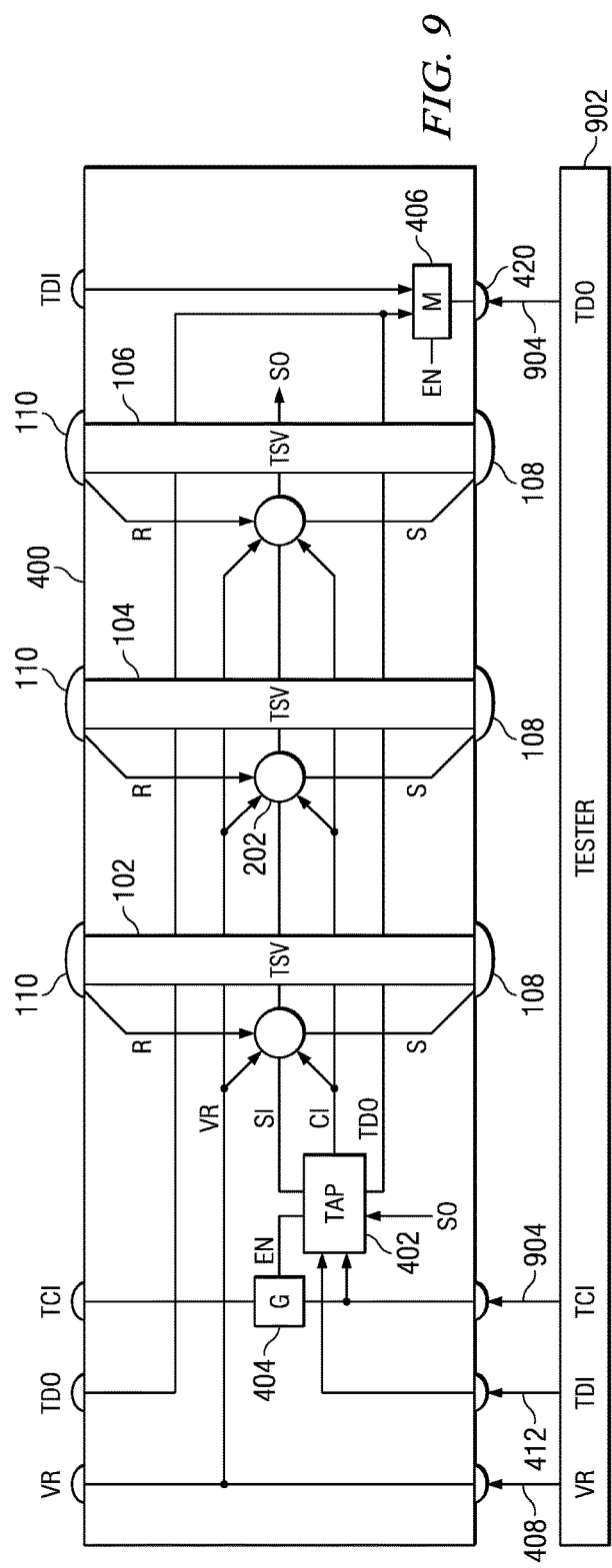

TSV TESTING METHOD AND APPARATUS

This application is a Divisional of prior application Ser. No. 15/151,008, filed May 10, 2016, now U.S. Pat. No. 9,835,678, issued Dec. 5, 2017;

Which was a divisional of prior application Ser. No. 14/734,682, filed Jun. 9, 2015, now U.S. Pat. No. 9,362,188, issued Jun. 7, 2016;

Which was a Divisional of prior application Ser. No. 13/649,808, filed Oct. 11, 2012, now U.S. Pat. No. 9,081,064, issued Jul. 14, 2015;

And also claims priority from Provisional Application No. 61/577,384, filed Dec. 19, 2011;

And also claims priority from Provisional Application No. 61/548,503, filed Oct. 18, 2011.

FIELD OF THE DISCLOSURE

This disclosure relates generally to die having through silicon/substrate vias (TSVs) and specifically to the testing of the TSVs.

BACKGROUND OF THE DISCLOSURE

Integrated circuit die may be designed for stacking using TSVs. TSVs are vertical conductive paths formed between the bottom surface of the die and top surface of the die. TSVs may be formed in the die using conductive material, such as but not limited to copper. TSVs allow thousands or tens of thousands of vertical connections to be made between the dies in a stack. The advantage of stacking die using TSVs over older approaches, such as die stacking based on peripheral bond wire connections, is a greater number of higher speed interconnects may exist between die in a stack. Also the physical size of the die stack is reduced since the TSV connections are made between the bottom and top surfaces of the die, i.e. the die do not need a periphery connection area.

FIG. 1 illustrates a die 100 including TSVs 102-106. Each TSV is a conductive path between the bottom surface and top surface of the die. A TSV could be used for providing a voltage bus, a ground bus or a signal bus between the bottom and top surface of the die. As seen each TSV 102-106 is electrically connected to a contact point 108, for example metal pad or a micro bump, on the bottom surface and a contact point 110 on the top surface. The wording bottom and top surfaces used herein are for simplifying the descriptions of the Figures of this disclosure, they are not intended to define or specify any orientation of how the die surfaces in a stack are connected.

During the manufacture of Die 100, each TSV 102-106 should be tested for connectivity between contact points 108 and 110. In addition to connectivity, the resistance of TSVs between contact points 108 and 110 need to be tested. For example the resistance of TSVs that provide power, ground and high performance signaling paths should be tested. If die 100 had ten thousand TSVs to test, a tester would have to have the resources to test all ten thousand TSVS, which can be very expensive proposition.

The following disclosure describes a method and apparatus for testing TSVs using a scan path architecture that includes scan cells adapted for testing TSVs.

BRIEF SUMMARY OF THE DISCLOSURE

The following disclosure describes a method of testing TSVs using a scan path architecture including scan cells adapted for testing TSVs.

BRIEF DESCRIPTIONS OF THE VIEWS OF THE DRAWINGS

FIGS. 6-8 illustrates example implementations of the gating circuit in FIG. 4, according to the disclosure.

FIG. 9 illustrates the die of FIG. 4 connected to a tester, according to the disclosure.

DETAILED DESCRIPTION OF THE DISCLOSURE

Figure 1:
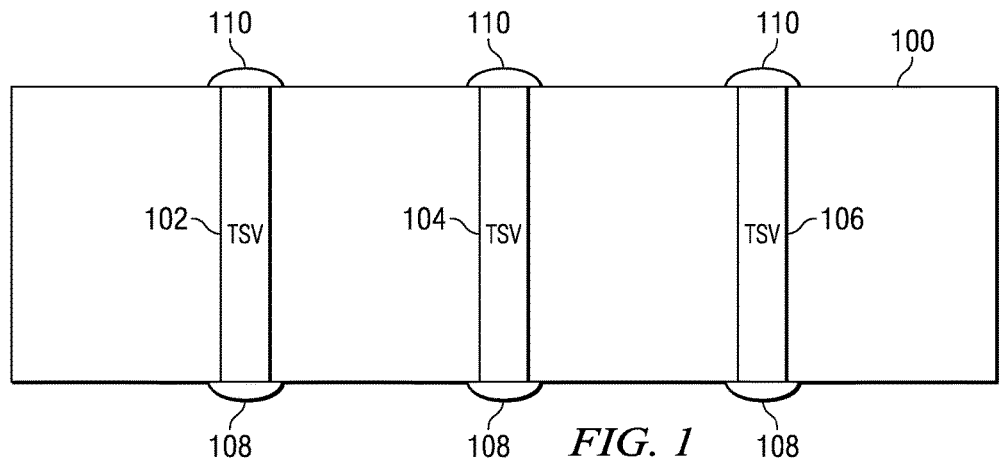
FIG. 1 illustrates a die with TSVs and contact points.
Figure 2:
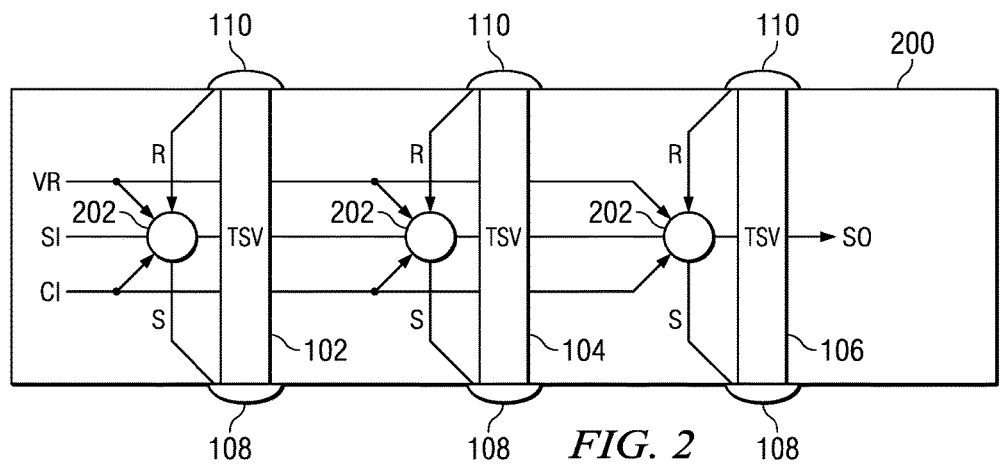
FIG. 2 illustrates a TSV scan path for testing the TSVs and contact points, according to the disclosure.

FIG. 2 illustrates a die 200 with TSVs 102-106 each connected to contact points 108 and 110. According to the disclosure, each TSV and associated contact points are augmented with a scan cell 202. Each scan cell has a test response (R) input, a voltage reference (VR) input, a scan input (SI), control inputs (CI), a scan output (SO) and a test stimulus (S) output. The response (R) input is connected to TSV contact point 110 and the stimulus (S) output is connected to TSV contact point 108. The scan cells are connected serially via their SI and SO to form a scan path, as shown. The VR inputs to the scan cells are all connected together and the CI inputs to the scan cells are all connected together, again as shown.

Figure 3:
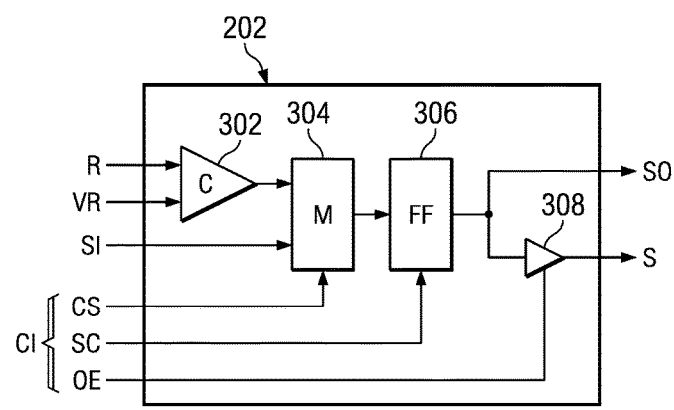
FIG. 3 illustrates a scan cell for testing the TSVs and contact points, according to the disclosure.

FIG. 3 illustrates an example implementation of scan cell 202, including a comparator (C) 302, a multiplexer (M) 304, a flip flop (FF) 306 and a 3-state buffer/Op-Amp, 308, all connected as shown. Comparator 302 has inputs for the response (R) input and voltage reference (VR) input and an output. Multiplexer 304 has inputs for the output of the comparator, the scan input (SI), a capture and shift (CS) input and an output. The FF 306 has an input for the output of the multiplexer, a scan clock (SC) input and an output connected to the serial output (SO) of the scan cell 202. The 3-state buffer has an input for the output of the FF, an output enable (OE) input and an output connected to the stimulus (S) output of the scan cell 202. The CS, SC and OE signals come from the CI bus.

When accessed, scan cell 202 operates in either a capture or shift mode. The capture and shift operation modes of the scan cell are controlled by the control inputs (CI) to the scan cell. During capture operations, the output of comparator 302 is selected to be loaded into FF 306 during a SC input, via multiplexer 304. During shift operations, FF 306 shifts data from SI to SO during SC inputs, via multiplexer 304. During either the capture or shift operation, 3-state buffer 308 may be enabled or disabled by the OE input. If disabled, the data contained in FF 306 will not be asserted onto the stimulus (S) output to TSV contact point 108, i.e. contact point 108 will not be electrically stimulated by the data from FF 306. If enabled, the data contained in FF 306 will be asserted onto the stimulus (S) output to TSV contact point 108, i.e. contact point 108 will be electrically stimulated by a voltage (Gnd or V+) in response to the data value (0 or 1) contained in FF 306. During all capture operations, the response (R) voltage present on contact point 110 is loaded into the FF. The VR input to comparator 302 is set to a desired voltage reference level that will digitize the response (R) voltage on contact point 110 to a logical one or zero to be input to FF 306 via multiplexer 304.

While FIG. 3 shows one example implementation of a scan cell for testing TSVs and contact points 108 and 110, the disclosure is not limited to this one example scan cell implementation. Indeed other scan cell implementations may be devised. The only thing that is required in the scan cell is the ability to digitize the reference (R) input against a voltage reference and the ability to drive a stimulus (S) voltage to contact point 108.

Figure 4:
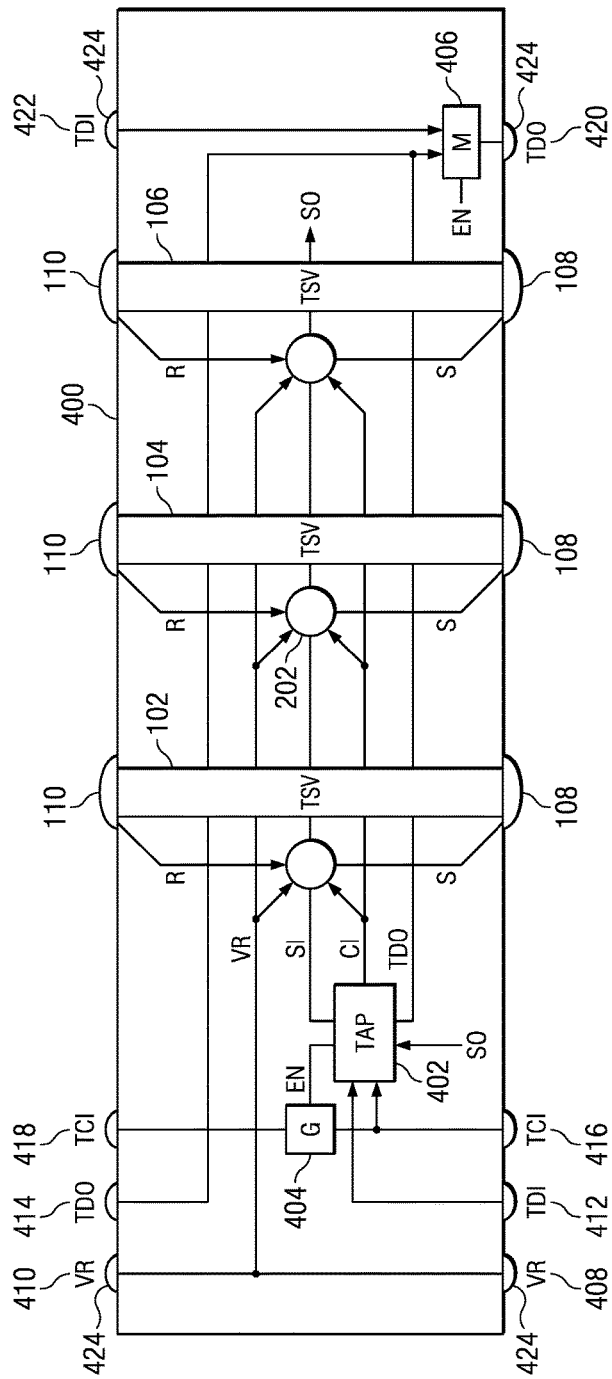
FIG. 4 illustrates a die with an IEEE 1149.1 TAP controlling the TSV scan path, according to the disclosure.

FIG. 4 illustrates a die 400 including an IEEE 1149.1 TAP 402 connected to the TSV scan path. The TAP has a data output for providing the SI input to the TSV scan path, control outputs for providing the CI inputs to the TSV scan path, a data input for receiving the SO output from the TSV scan path and an enable (EN) output for control a gating circuit 404 to couple or decouple the TCI 416 test contact points 424 on the bottom surface of the die to TCI 418 test contact points 424 on the top surface of the die. The TAP receives a TDI input 412 from a test contact point 424 on the bottom surface of the die. The TAP receives TAP control inputs (TCI) 416 from test contact points 424 on the bottom surface of the die. The TAP has a TDO output that is input to multiplexer 406 and connected to a TDO 414 test contact point 424 on the top surface of the die.

Multiplexer 406 inputs the EN control signal from the TAP, the TDO signal from the TAP, a TDI signal 422 from a test contact point 424 on the top surface of the die and outputs TDO signal 420 to a test contact point 424 on the bottom surface of the die. The EN signal controls whether multiplexer 404 couples the TDO output from the TAP or the TDI input 422 from test contact 424 to the TDO 420 test contact point 424.

The VR signal 408 to the scan cells 202 of the TSV scan path is provided by a test contact point 424 on the bottom surface of the die. The VR signal 408 is also connected, by a TSV, to a VR signal 410 test contact point 424 on the top surface of the die.

Figure 5:
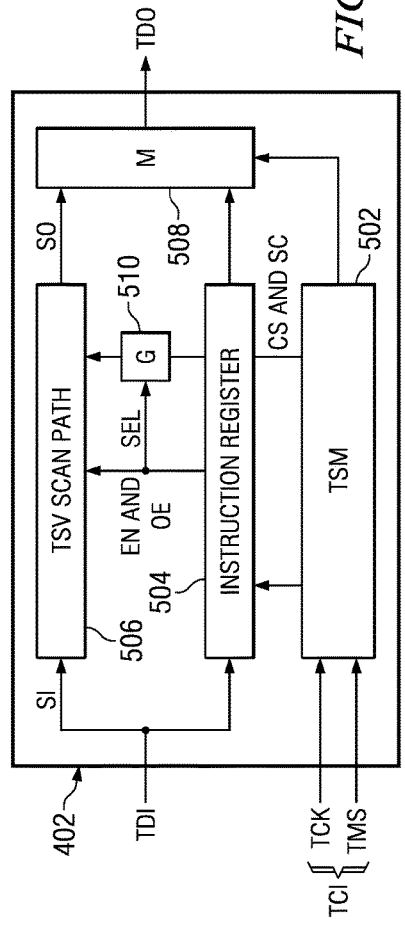
FIG. 5 illustrates an example of the TAP.

FIG. 5 illustrates an example implementation of TAP 402 which includes a TAP state machine (TSM) 502, an instruction register 504, the TSV scan path 506, multiplexer 508 and a gating circuit 510. The TSM 502 operates in response to TMS and TCK inputs provided on the TCI bus to either shift data through the instruction register 504 or the TSV scan path data register 506 from TDI to TDO. TAP instruction and data scan operations are well known in the industry and described in IEEE standard 1149.1. While the TSV scan path data register is the only data register shown in this example, the TAP may include any number of other data registers.

When an instruction is loaded into the instruction register to select the TSV scan path data register 506, a select (SEL) signal is output from the instruction register to gating circuit 510 to couple CS and SC outputs from the TSM to the CS and SC inputs of the TSV scan path. The CS TAP output can be the TAP's Shift-DR signal and the SC TAP output can be the TAP's Clock-DR signal. The loaded instruction also outputs the EN signal to control gating circuit 404 and control multiplexer 406, and the OE signal to control the buffers in the scan cells 202 of the TSV scan path. The settings of the EN and OE signals are determined by what type of test is to be performed by the TSV scan path. Thus there are multiple types of TSV scan path test instructions.

FIG. 6 illustrates an example gating circuit 404. This gating circuit gates on or off both the TMS and TCK signals between the bottom TCI test contact points 416 and top TCI test contact point 418, in response to the setting of the EN signal.

FIG. 7 illustrates an example gating circuit 404. This gating circuit gates on or off only the TMS signal between the bottom TCI test contact points 416 and top TCI test contact point 418, in response to the setting of the EN signal.

FIG. 8 illustrates an example gating circuit 404. This gating circuit gates on or off only the TCK signal between the bottom TCI test contact points 416 and top TCI test contact point 418, in response to the setting of the EN signal.

FIG. 9 illustrates the bottom surface VR 408, TDI 412, TCI 416 and TDO 420 contact points 424 of die 400 connected to a tester 902 by contact probes 904. This arrangement allows testing continuity of each TSV 102-106 from the TSV's bottom contact point 108 to top contact point 110. This arrangement also allows testing for shorts between TSVs 102-106 and shorts between the top 110 and bottom 108 TSV contact points. The test is conducted by the tester operating the TAP 402 too; (1) input a stimulus test pattern to the TSV scan path from TDI 412, (2) apply the stimulus test pattern to contact points 108 via the scan cell S outputs, (3) capture the response test pattern from contact points 110 the into the scan cells via the R inputs, and (4) output the response test pattern on TDO 420. This operation is repeated until all TSV test patterns have applied. During this test the EN signal is set to disable gating circuit 404 and to control multiplexer 406 to output the TAP TDO to TDO 420. Also during this test the OE from the TAP is set to enable the buffers of the scan cells 202 of the TSV scan path. The tester also controls the voltage input on the VR signal 408 to the digitizing comparators of the scan cells 202 of the TSV scan path.

Figure 10:
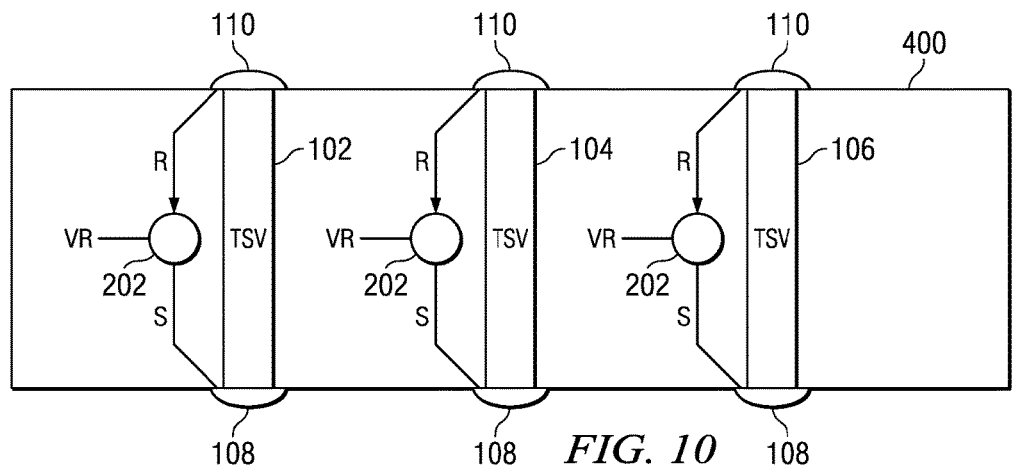
FIG. 10 illustrates a first example of testing the TSV and contact points for continuity and shorts using the TSV scan path, according to the disclosure.
Figure 11:
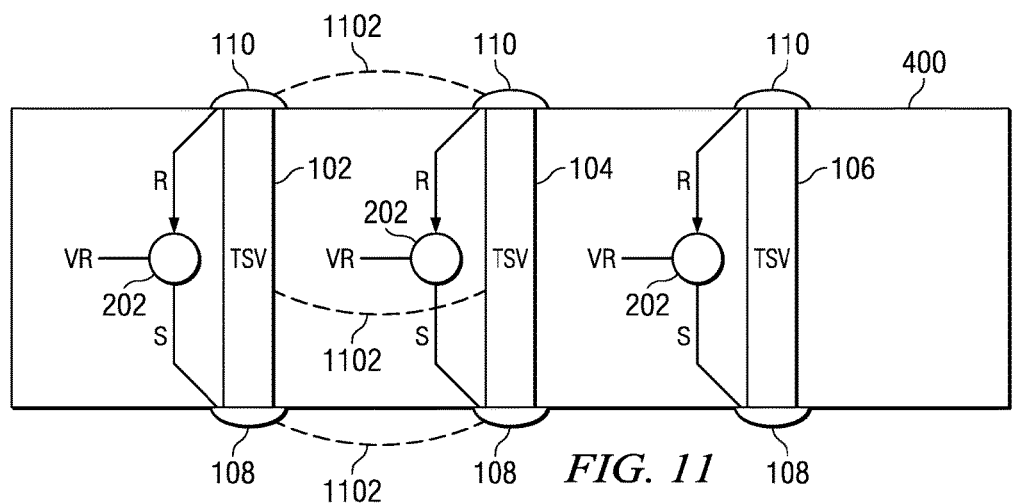
FIG. 11 illustrates a second example of testing the TSVs and contact points for continuity and shorts using the TSV scan path, according to the disclosure.

FIGS. 10 and 11 below describe using the TSV scan path of FIG. 9 to test TSVs in a fault free die (FIG. 10) and in a faulty die (FIG. 11).

FIG. 10 illustrates an example two step process of testing fault-free TSVs and contact points in a simplified view of die 400. This example assumes the scan cell buffers have equal pull-up and pull-down drive strengths on the S output. The scan cell buffers are enabled by the OE signal during this test.

TSV Scan Test Step 1:

A: Set VR to the scan cells to $\frac{2}{3}$ of the voltage output on the scan cell S outputs when the scan cell contains a logic 1.

B: Scan a "101" S pattern into the scan cells to drive contact points 108.

C: Capture a digitized R pattern into the scan cells from contact points 110 and scan it out of the scan cells. Verify the R pattern is equal to the S pattern.

D: Set VR to the scan cells to $\frac{1}{3}$ of the voltage output on the scan cell S outputs when the scan cell contains a logic 1.

E: Scan a "101" S pattern into the scan cells to drive contact points 108.

F: Capture a digitized R pattern into the scan cells from contact points 110 and scan it out of the scan cells. Verify the R pattern is equal to the S pattern.

TSV Scan Test Step 2:

(A): Set VR to the scan cells to $\frac{1}{3}$ of the voltage output on the scan cell S outputs when the scan cell contains a logic 1.

(B): Scan a "010" S pattern into the scan cells to drive contact points 108.

(C): Capture a digitized R pattern into the scan cells from contact points 110 and scan it out of the scan cells. Verify the R pattern is equal to the S pattern.

(D): Set VR to the scan cells to $\frac{1}{3}$ of the voltage output on the scan cell S outputs when the scan cell contains a logic 1.

(E): Scan a "010" S pattern into the scan cells to drive contact points 108.

(F): Capture a digitized R pattern into the scan cells from contact points 110 and scan it out of the scan cells. Verify the R pattern is equal to the S pattern.

The two step test process above verifies continuity between contact points 108 and 110 of each TSV 102-106. It also verifies that no shorts exists between TSVs 102-106 and their contact points 108 and 110. Each test step digitizes the voltage on the R input of the scan cell against a VR setting of $\frac{2}{3}$ the voltage applied from the S output and a VR setting of $\frac{1}{3}$ of the voltage applied from the S output. While this test used a "101" and "010" S pattern, any type of S patterns may be used. Also while voltage references of $\frac{2}{3}$ and $\frac{1}{3}$ were used, any desired voltage references may be used.

FIG. 11 illustrates the two step process of FIG. 10 testing TSVs and contact points in a simplified view of die 400 that includes a short 1102 between TSV 102 and 104. The short may exist internal of the die on the TSVs or external of the die at contact on points 108 and 110. Again, this example assumes the scan cell buffers have equal pull-up and pull-down drive strengths on the S output. The scan cell buffers are enabled by the OE signal during this test.

TSV Scan Test Step 1:

A: Set VR to the scan cells to $\frac{2}{3}$ of the voltage output on the scan cell S outputs when the scan cell contains a logic 1.

B: Scan a "101" S pattern into the scan cells to drive contact points 108.

C: Capture a digitized R pattern into the scan cells from contact points 110 and scan it out of the scan cells. Detect that the R pattern "001" is not equal to the S pattern "101".

D: Set VR to the scan cells to $\frac{1}{3}$ of the voltage output on the scan cell S outputs when the scan cell contains a logic 1.

E: Scan a "101" S pattern into the scan cells to drive contact points 108.

F: Capture a digitized R pattern into the scan cells from contact points 110 and scan it out of the scan cells. Detect that the R pattern "111" is not equal to the S pattern "101".

TSV Scan Test Step 2:

A: Set VR to the scan cells to $\frac{2}{3}$ of the voltage output on the scan cell S outputs when the scan cell contains a logic 1.

B: Scan a "010" S pattern into the scan cells to drive contact points 108.

C: Capture a digitized R pattern into the scan cells from contact points 110 and scan it out of the scan cells. Detect that the R pattern "000" is not equal to the S pattern "101".

D: Set VR to the scan cells to $\frac{1}{3}$ of the voltage output on the scan cell S outputs when the scan cell contains a logic 1.

E: Scan a "010" S pattern into the scan cells to drive contact points 108.

F: Capture a digitized R pattern into the scan cells from contact points 110 and scan it out of the scan cells. Detect that the R pattern "110" is not equal to the S pattern "101".

The two step test process above detects the short 1102 between TSVs 102 and 104. The detection is enabled by using a $\frac{2}{3}$ VR voltage setting and then a $\frac{1}{3}$ VR voltage setting on the VR input to the digitizing comparator of the scan cells during each test Step. For example, and assuming short 1102 is a low resistance short, a logic 1 (+V) applied to contact point 108 of TSV 102 and a logic 0 (Gnd) applied to contact point 108 of TSV 104 would result in a mid-point ($\frac{1}{2}$) voltage being present on the contact points 110 of TSVs 102 and 104. Digitizing that mid-point voltage against a $\frac{2}{3}$ V VR setting and then against a ⅓ V VR setting detects the short being between TSV 102 and TSV 104. While this test used a "101" and "010" S pattern, any type of S patterns may be used. Also while voltage references of ⅔ and ⅓ were used, any desired voltage references may be used.

Figure 12:
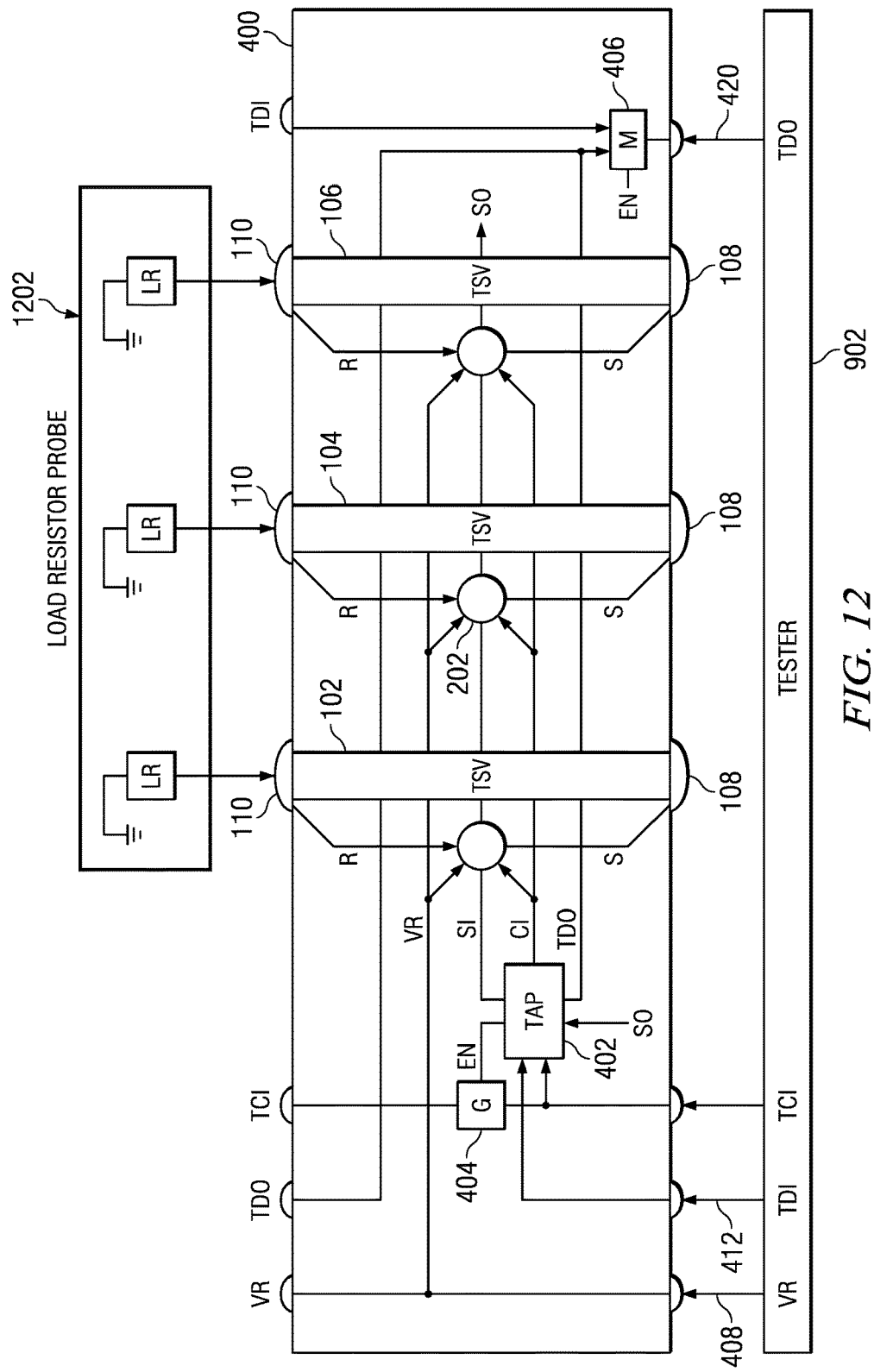
FIG. 12 illustrates the die of FIG. 4 connected to a tester and load resistors, according to the disclosure.

FIG. 12 illustrates die 400 connected to a tester 902 as described in FIG. 9. Additionally, load resistors, from a Load Resistor Probe 1202, are placed on TSV contact points 110. The resistance of the load resistor is known. This arrangement allows testing the resistance of each TSV 102-106 and their associated contact points 108 and 110. The test is conducted by the tester operating the TAP 402 too; (1) input a stimulus test pattern to the scan cells of the TSV scan path from TDI 412, (2) apply the stimulus test pattern to contact points 108 via the scan cell S outputs, (3) capture the response test pattern from contact points 110 the into the scan cells via the R inputs, and (4) output the response test pattern in the scan cells on TDO 420. This operation is repeated until all TSV test patterns have applied. During this test the EN signal is set to disable gating circuit 404 and to control multiplexer 406 to output the TAP TDO to TDO 420. Also during this test the OE from the TAP is set to enable the buffers of the scan cells 202 of the TSV scan path. The tester also controls the voltage input on the VR signal 408 to the digitizing comparators of the scan cells 202 of the TSV scan path. By knowing the value of the load resistors and the voltage applied to contact points 108 when the scan cells contain a logic one it is possible to determine if the resistance of each TSC 102-106 and associated contact points 108 and 110 is within an acceptable range by digitizing the voltage drop across each load resistor at contact point 110 using the VR input.

Figure 13:
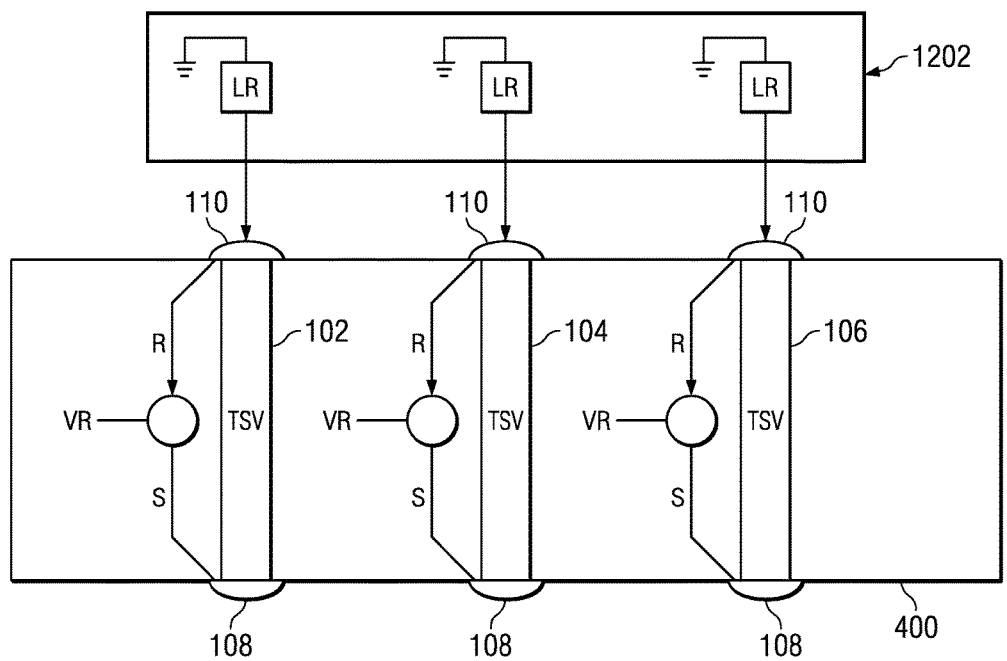
FIG. 13 illustrates an example of testing the resistance of the TSVs and contact points using the TSV scan path, according to the disclosure.

FIG. 13 illustrates an example process of testing the resistance of each TSV 102-108 and their contact points 108 and 110 in a simplified view of die 400 of FIG. 12. Typically this test would follow the above TSV continuity and shorts test described in FIGS. 10 and 11. The scan cell buffers are enabled by the OE signal during this test.

TSV & Contact Point Resistance Scan Test:

A: Set VR to the scan cells to a voltage reference level that should digitize the expected voltage drop across the load resistors (LR) to a logic 1 when the scan cells are loaded with a logic 1.

B: Scan a "111" S pattern into the scan cells to drive contact points 108.

C: Capture a digitized R pattern into the scan cells from contact points 110 and scan it out of the scan cells.

If the R pattern is "111", all TSV's pass the resistance test.
If the R pattern is "011", TSV 102 fails the resistance test passes.
If the R pattern is "101", TSV 104 fails the resistance test.
If the R pattern is "110" TSV 106 fails the resistance test.
If the R pattern is "000", all TSVs fail the resistance test.

D: If desired Repeat A through C with different voltage reference settings on the VR inputs to the scan cells.

Note: While the example of FIG. 13 used a "111" S pattern, it is not limited to only using a "111" S pattern. Indeed, any desired S pattern may be used.

Figure 14:
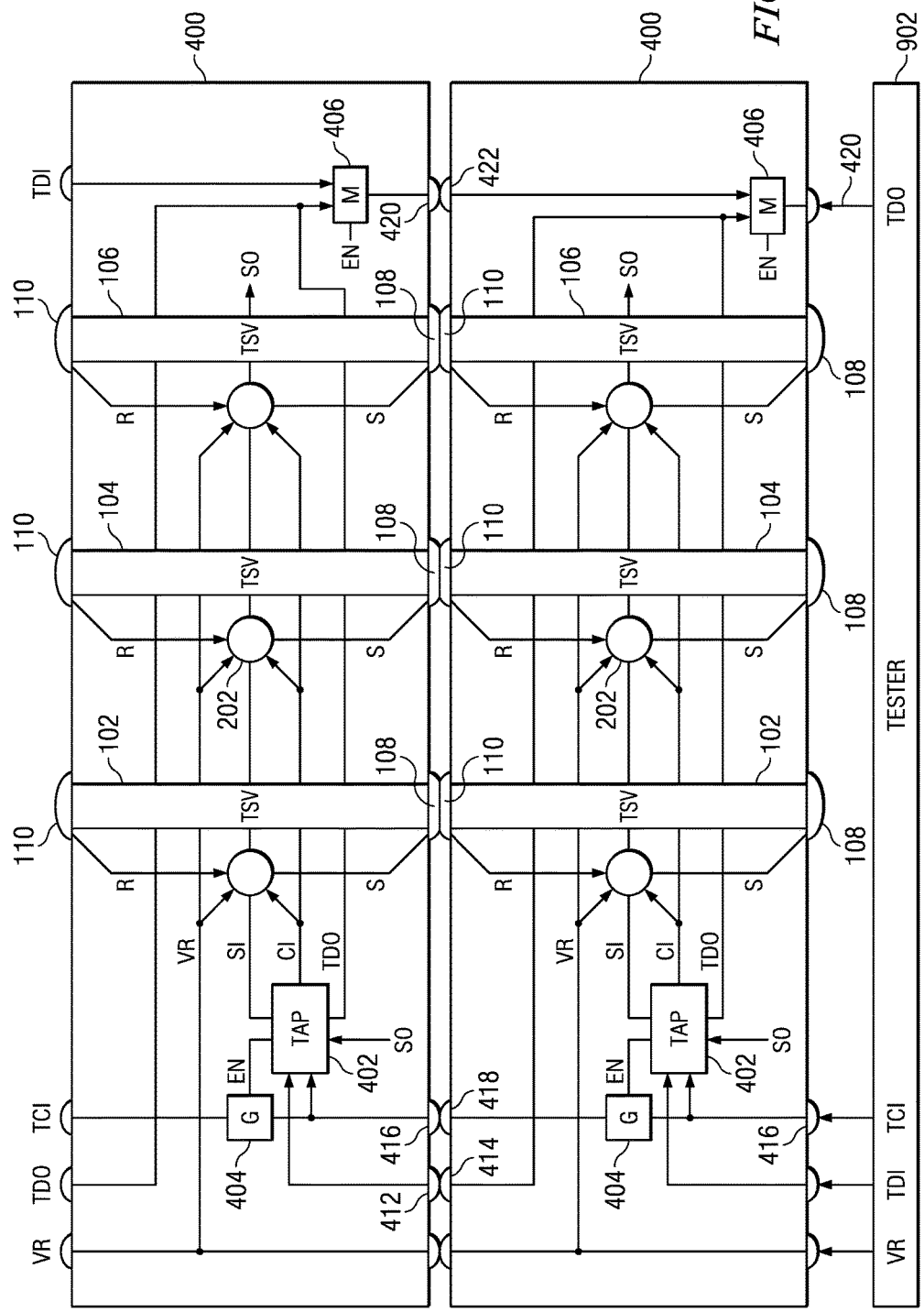
FIG. 14 illustrates a top die of FIG. 4 stacked on top of a bottom die of FIG. 4, where the bottom die is connected to a tester, according to the disclosure.

FIG. 14 illustrates a stack die assembly consisting of a top die 400 connected to a bottom die 400 via test and TSV contact points. Before stacking the die, the TSVs of each die 400 were tested by a tester, as previously described in FIGS. 9-13 and found to be good. After stacking the die, the die TSV's should be retested for continuity and shorts to ensure a good connection between the TSVs of the stack of die. To perform this test, a tester 902 is connected to the test contact points on the bottom surface of the bottom die. The tester accesses the TAP 402 of the bottom die and loads an instruction into the TAP instruction register. The instruction sets the EN signal to couple TCI bus 416 to TCI bus 418 and to couple TDI 422 to TDO 420. Following this instruction the TAP of the top die is connected in series with the TAP of the bottom top die. The TAP of the top die can input TDI 412 from TDO 414 of the bottom die, input TCI 416 from TCI 418 of the bottom die, and output TDO 420 to TDI 422 of the bottom die, via multiplexer 406. Next, the tester accesses the serially connected TAPs 402 of both the bottom a top die to load instructions. The instruction loaded into the bottom die maintains the ENA setting, selects the TSV scan path of the bottom die and sets the OE signal to enable the buffers in the scan cells of the TSV scan path of the bottom die. The instruction loaded into the top die selects the TSV scan path of the top die and sets the OE signal to disable the buffers in the scan cells of the TSV scan path of the top die.

After this setup, the tester accesses the TSV scan paths of the bottom and top die to load test patterns. The test patterns loaded into the TSV scan path of the bottom die drive the contact points 108 of the bottom die, since the buffers of the scan cells are enabled. However the test patterns loaded into the TSV scan path of the top die do not drive the contact points 108 of the top die, since the buffers of the scan cells are disable. For each connected TSV, when a logic 1 is driving a TSV contact point 108 of the bottom die, a logic 1 should be present at an associated TSV contact point 110 of the bottom die, at an associated TSV contact point 108 of the top die and at an associated TSV contact point 110 of the top die. For each connected TSV, when a logic 0 is driving a TSV contact point 108 of the bottom die, a logic 0 should be present at an associated TSV contact point 110 of the bottom die, at an associated TSV contact point 108 of the top die and at an associated TSV contact point 110 of the top die. Continuity and shorts testing of the stacked TSVs is accomplished by shifting stimulus test patterns into the TSV scan paths of the bottom die to drive the contact points 108 of the bottom die, then capturing digitized response (R) patterns from the contact points 110 of the bottom and top die into the TSV scan paths and shifting the captured response patterns out of the TSV scan paths of the bottom and top die. The continuity and shorts test occurs as described in regard to FIGS. 10 and 11. The only difference in FIG. 14 is that two connected TSVs are being tested for continuity and shorts, instead of just one TSV as shown in FIGS. 10 and 11.

Figure 15:
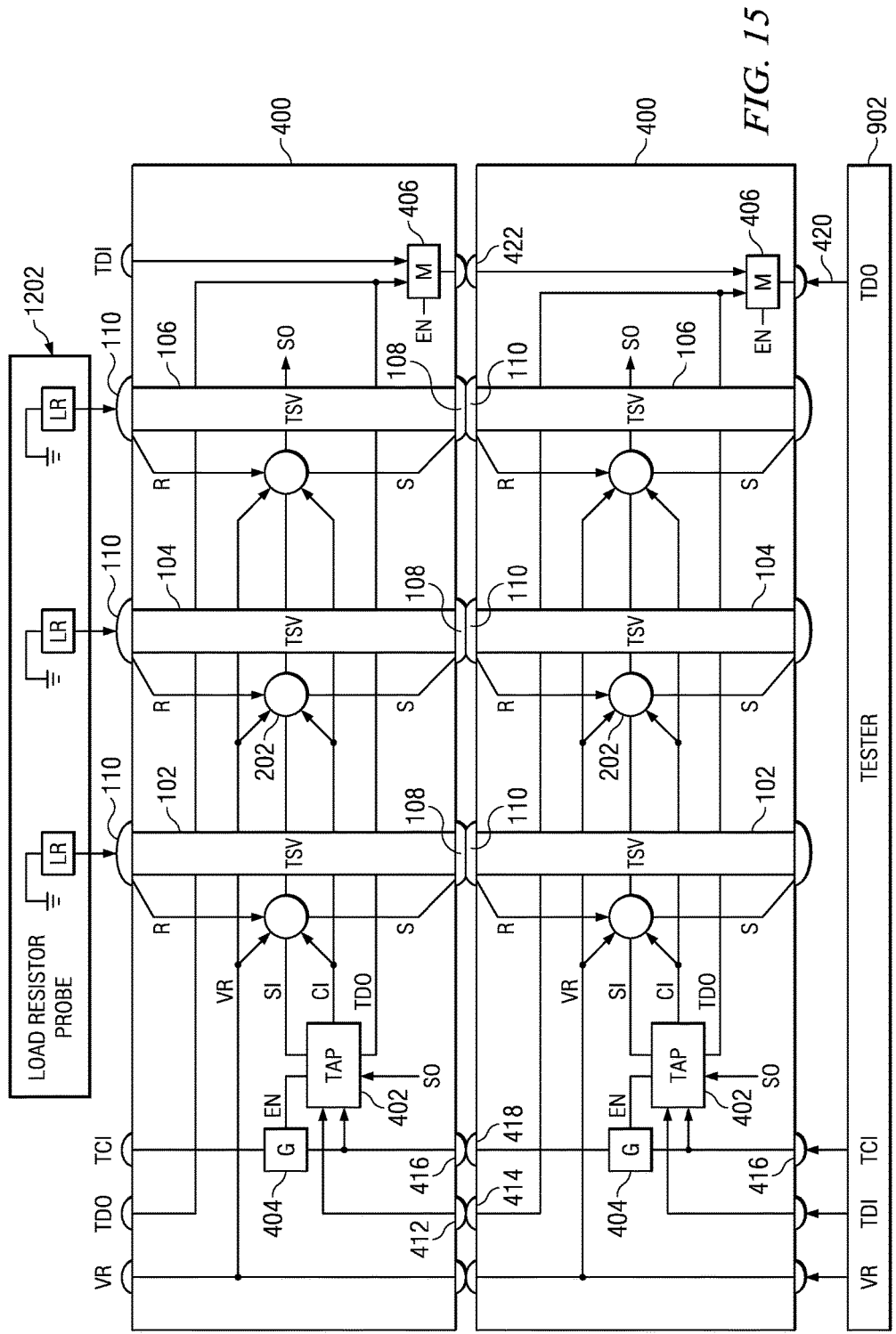
FIG. 15 illustrates a top die of FIG. 4 stacked on top of a bottom die of FIG. 4, the bottom die is connected to a tester and the top die is connected to load resistors, according to the disclosure.

FIG. 15 illustrates a stack die assembly consisting of a top die 400 connected to a bottom die 400 via test and TSV contact points. Before stacking the die, the TSVs of each die 400 were tested by a tester, as previously described in FIGS. 9-13 and found to be good. After stacking the die, the die TSV's should be retested for resistance to ensure a good low resistance connection between the TSVs of the stack. To perform this test, a tester 902 is connected to the test contact points on the bottom surface of the bottom die and load resistors are connected to contact points 110 of the top die. The tester accesses the TAP 402 of the bottom die and loads an instruction into the TAP instruction register. The instruction sets the EN signal to couple TCI bus 416 to TCI bus 418 and to couple TDI 422 to TDO 420. Following this instruction the TAP of the top die is connected in series with the TAP of the bottom top die. The TAP of the top die can input TDI 412 from TDO 414 of the bottom die, input TCI 416 from TCI 418 of the bottom die, and output TDO 420 to TDI 422 of the bottom die, via multiplexer 406. Next, the tester accesses the serially connected TAPs 402 of both the bottom a top die to load instructions. The instruction loaded into the bottom die maintains the ENA setting, selects the TSV scan path of the bottom die and sets the OE signal to enable the buffers in the scan cells of the TSV scan path of the bottom die. The instruction loaded into the top die selects the TSV scan path of the top die and sets the OE signal to disable the buffers in the scan cells of the TSV scan path of the top die.

After this setup, the tester accesses the TSV scan paths of the bottom and top die to load test patterns. The test patterns loaded into the TSV scan path of the bottom die drive the contact points 108 of the bottom die with a known voltage, since the buffers of the scan cells are enabled. However the test patterns loaded into the TSV scan path of the top die do not drive the contact points 108 of the top die, since the buffers of the scan cells are disable. For each connected TSV, when a logic 1 voltage is driving a TSV contact point 108 of the bottom die, a logic 1 voltage should be present at an associated TSV contact point 110 of the bottom die, at an associated TSV contact point 108 of the top die and at an associated TSV contact point 110 of the top die. For each connected TSV, when a logic 0 voltage is driving a TSV contact point 108 of the bottom die, a logic 0 voltage should be present at an associated TSV contact point 110 of the bottom die, at an associated TSV contact point 108 of the top die and at an associated TSV contact point 110 of the top die. Resistance testing of the stacked TSVs is accomplished by shifting stimulus test patterns into the TSV scan paths of the bottom die to drive a known voltage onto the contact points 108 of the bottom die, then capturing digitized voltage response (R) patterns from the contact points 110 of the bottom and top die into the TSV scan paths and shifting the captured response patterns out of the TSV scan paths of the bottom and top die. The VR input to the scan cells is set to detect an expected voltage drop level across the load resistors connected to contact points 110 of the top die as described in FIGS. 12 and 13. The only difference in FIG. 15 is that the combined series resistance of two connected TSVs are being tested instead of the resistance of a single TSV as shown in FIGS. 12 and 13. If desired the VR input to the scan cells can be adjusted and the test repeated to digitize and capture the voltage levels on the contact points 110 and 108 between the bottom and top die.

Figure 16:
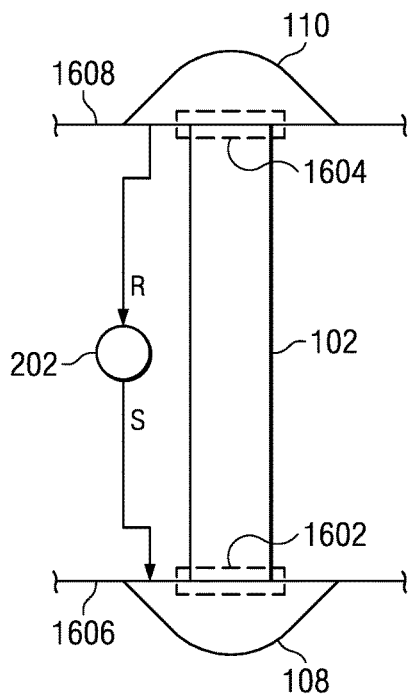
FIG. 16 illustrates the scan cell of FIG. 3 connected to a top contact point and a bottom contact point associated with a TSV, according to the disclosure.

FIG. 16 illustrates a TSV 102 having a contact point 108 on the bottom surface 1606 a die and contact point 110 on top surface 1608 of the die. As seen the S output of a scan cell 202 is connected to contact point 108 and the R input to the scan cell is connected to contact point 110. A connection 1602 exists between contact point 108 and TSV 102 and a connection 1604 exists between contact point 110 and TSV 102. When contact point 108 is driven by a voltage from the S output of the scan cell 202, contact point 110 is also driven by the voltage via the TSV connections 1602 and 1604. Scan cell 202 can digitized and capture the voltage driven from contact point 110 via it R input.

Figure 17:
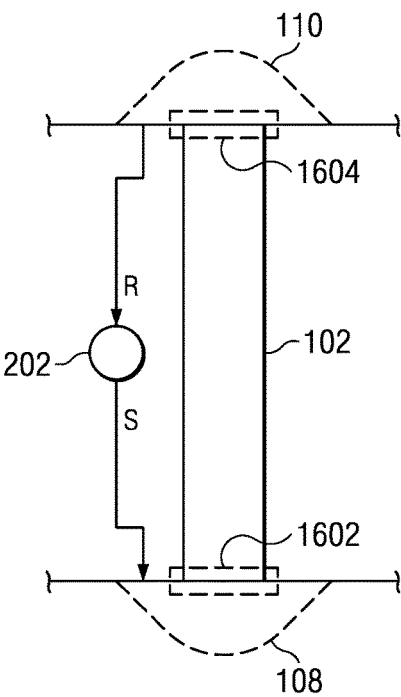
FIG. 17 illustrates the arrangement of FIG. 16 in the absence of the contact points, according to the disclosure.

FIG. 17 illustrates a TSV 102 where the contacts points 108 and 110 have not been yet been formed on surfaces of the die and connected to the TSV. Without the contact points the TSV cannot be tested by the scan cell's S output and R input, since there are no connections 1602 and 1604.

Figure 18:
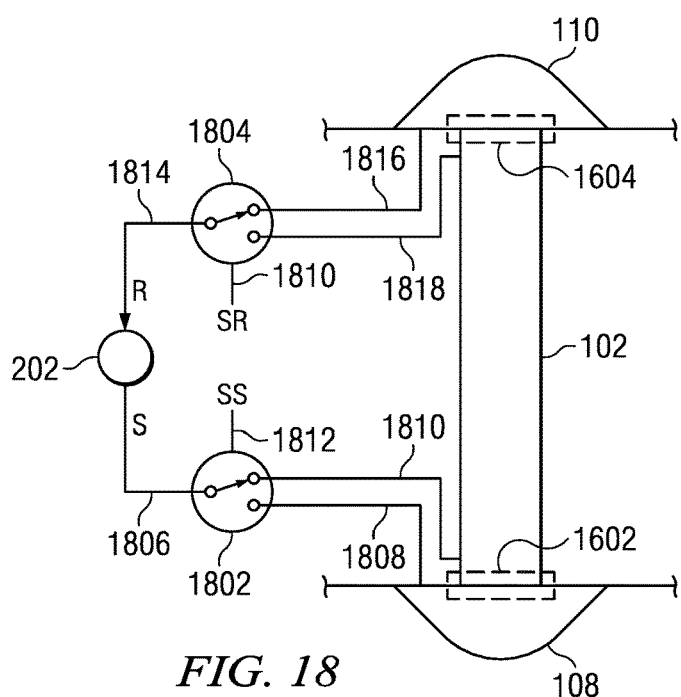
FIG. 18 illustrates switches for selectively connecting the scan cell to either the contact points or to the TSV, according to the disclosure.

FIG. 18 illustrates an improvement to the disclosure to allow testing TSVs in the absence of contact points 108 and 110 on the surfaces of the die. The improvement includes adding two analog switches 1802 and 1804. Switch 1802 has a terminal 1806 connected to the S output of the scan cell 202, a terminal 1808 connected to contact point 108, a terminal 1810 connected to the TSV at a point in close proximity to connection 1602 and a Select Stimulus (SS) control input 1812. Switch 1804 has a terminal 1814 connected to the R input to the scan cell 202, a terminal 1816 connected to contact point 110, a terminal 1818 connected to the TSV at a point in close proximity to connection 1604 and a Select Response (SR) control input 1820.

If contact points 108 and 110 are present, switch 1802 is controlled by the SS input to couple the S output 1806 of the scan cell 202 to contact point 108 via terminal 1808 and switch 1804 is controlled by the SR input to couple the R input 1814 of the scan cell 202 to contact point 110 via terminal 1816. In this arrangement continuity, shorts and resistance testing of the TSV and contact points 108 and 110 can occur as previously described.

If contact point 108 is present but contact point 110 is not present, switch 1802 is controlled by the SS input to couple the S output 1806 of the scan cell 202 to contact point 108 via terminal 1808 and switch 1804 is controlled by the SR input to couple the R input 1814 of the scan cell 202 to the TSV via terminal 1818. In this arrangement continuity and shorts testing of the TSV and contact point 108 can occur as previously described.

If contact point 110 is present but contact point 108 is not present, switch 1802 is controlled by the SS input to couple the S output 1806 of the scan cell 202 to the TSV via terminal 1810 and switch 1804 is controlled by the SR input to couple the R input 1814 of the scan cell 202 to contact point 110 via terminal 1816. In this arrangement continuity, shorts and resistance testing of the TSV and contact point 110 can occur as previously described.

If contact points 108 and 110 are not present, switch 1802 is controlled by the SS input to couple the S output 1806 of the scan cell 202 to the TSV via terminal 1810 and switch 1804 is controlled by the SR input to couple the R input 1814 of the scan cell 202 to the TSV via terminal 1818. In this arrangement continuity and shorts testing of the TSV can occur as previously described.

Figure 19:
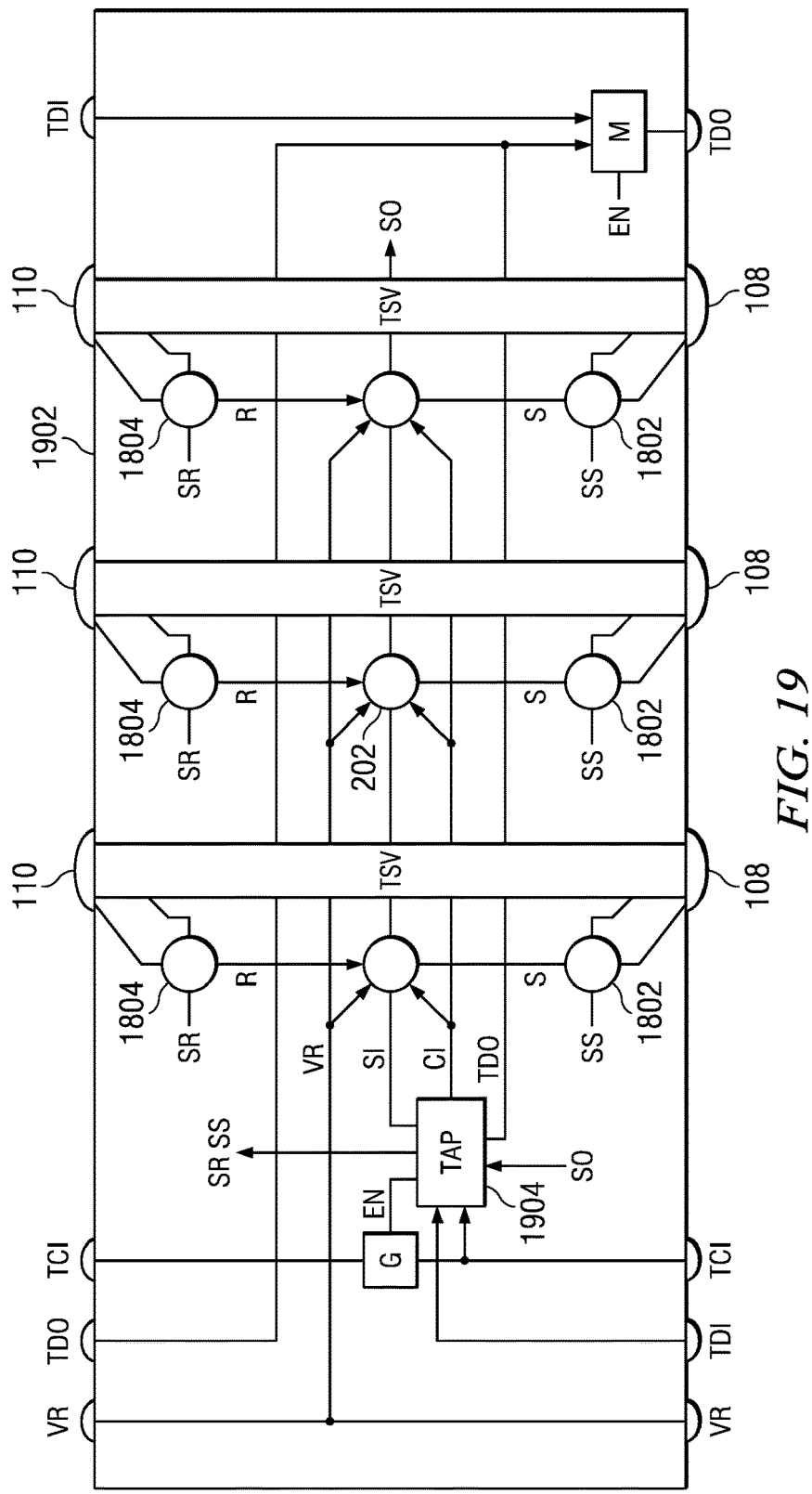
FIG. 19 illustrates the die of FIG. 4 augmented to include the switches of FIG. 18, according to the disclosure.

FIG. 19 illustrates a die 1902 including an IEEE 1149.1 TAP 1904, the TSV scan path and switches 1802 and 1804. Die 1902 is identical to die 400 of FIG. 4 with the exceptions that it contains the switches 1802 and 1804 and the TAP 1904 has been designed to provide the SS and SR control output signals to switches 1802 and 1804.

Figure 20:
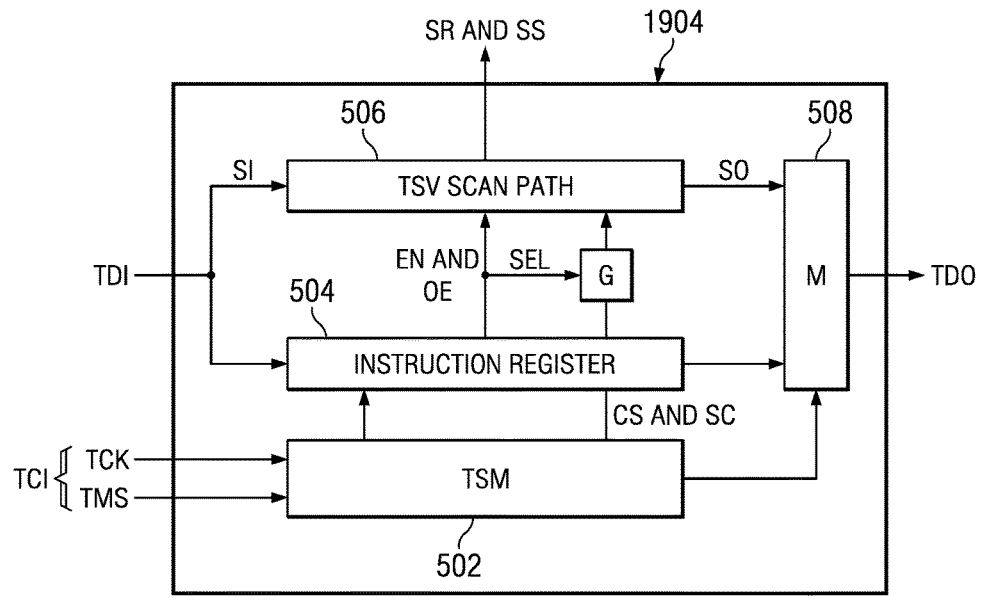
FIG. 20 illustrates the TAP of FIG. 5 augmented to include control signals from the instruction register to control the switches, according to the disclosure.

FIG. 20 illustrates a first example implementation of TAP 1904. TAP 1904 is identical to TAP 402 of FIG. 5 with the exception that the instruction register 504 includes outputs for providing the SR and SS control signals. The SR and SS control signals are set according to instructions loaded into the Instruction register. The SR control signal can be set to couple the R input of the scan cells 202 to either the TSV or to contact point 110, as mentioned in regard to FIG. 18. The SS control signal can be set to couple the S output of the scan cells 202 to either set the TSV or to contact point 108, as mentioned in regard to FIG. 18.

Figure 21:
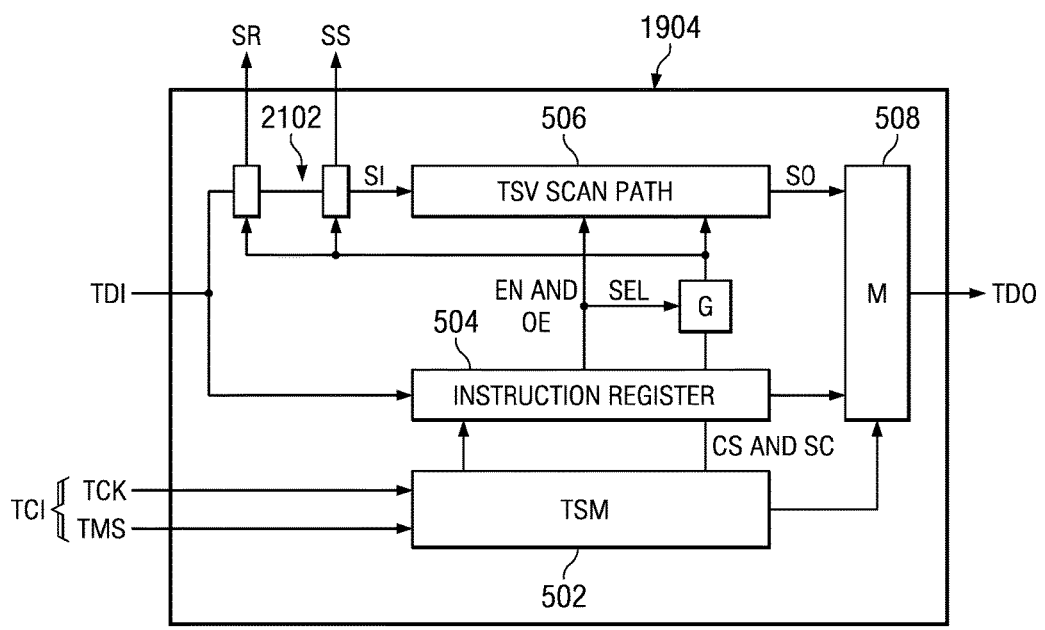
FIG. 21 illustrates the TAP of FIG. 5 augmented to include control signals from scan cells in series with the TSV scan path to control the switches, according to the disclosure.

FIG. 21 illustrates a second example implementation of TAP 1904. TAP 1904 is identical to TAP 402 of FIG. 5 with the exception that two scan cells 2102 have been inserted in series with the TSV scan path. One scan cell provides the SR control signal and the other scan cell provides the SS control signal. Data bits are loaded into the scan cells during scan access of the TSV scan path. The data bits control the setting of the SR and SS control signals. The SR control signal can be set to couple the R input of the scan cells 202 to either the TSV or to contact point 110, as mentioned in regard to FIG. 18. The SS control signal can be set to couple the S output of the scan cells 202 to either set the TSV or to contact point 108, as mentioned in regard to FIG. 18. While the example shows the two scan cells 2102 being located ahead of the TSV scan path, they can be located after the TSV scan path or one can be located ahead and one located after the scan path as well.

Referring back to FIGS. 12, 13 and 15 it is seen that for resistance testing of the TSVs and contact points 108 and 110, it is necessary to touch the contact points 110 of the die using an external load resistance probe 1202. Assuming 10,000 TSVs in a die, that would mean that 10,000 contact points 110 had to be touched.

If the load resistor probe had the capability of touching all 10,000 contact points 110, all 10,000 TSVs could be tested in a single scan test operation, as previously described. This would require a very expensive load resistor probe and probably would not be possible due to the amount of pressure being applied to the die from the 10,000 probe points.

If the load resistor probe only had the ability of touching say 100 contact points 110 at a time, performing a scan test on 100 TSVs then lifting up and touching down on other remaining groups of 100 contact points 110 to test their TSVs, the probe movement and scan test would have to be repeated 100 times to test all 10,000 TSVS. This could be done, but the TSV test time would be significantly increased.

Figure 22:
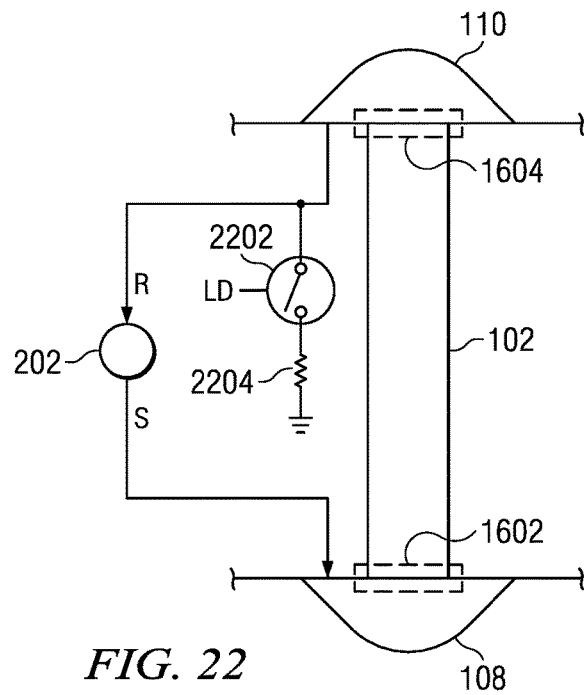
FIG. 22 illustrates the TSV arrangement of FIG. 16 including a switchable load resistor on contact point 110, according to the disclosure.
Figure 23:
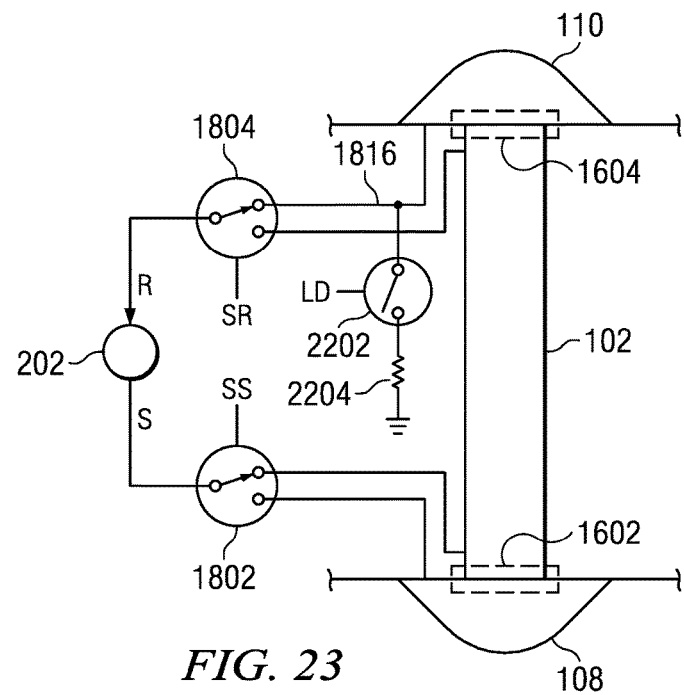
FIG. 23 illustrates the TSV arrangement of FIG. 18 including a switchable load resistor on contact point 110, according to the disclosure.
Figure 24:
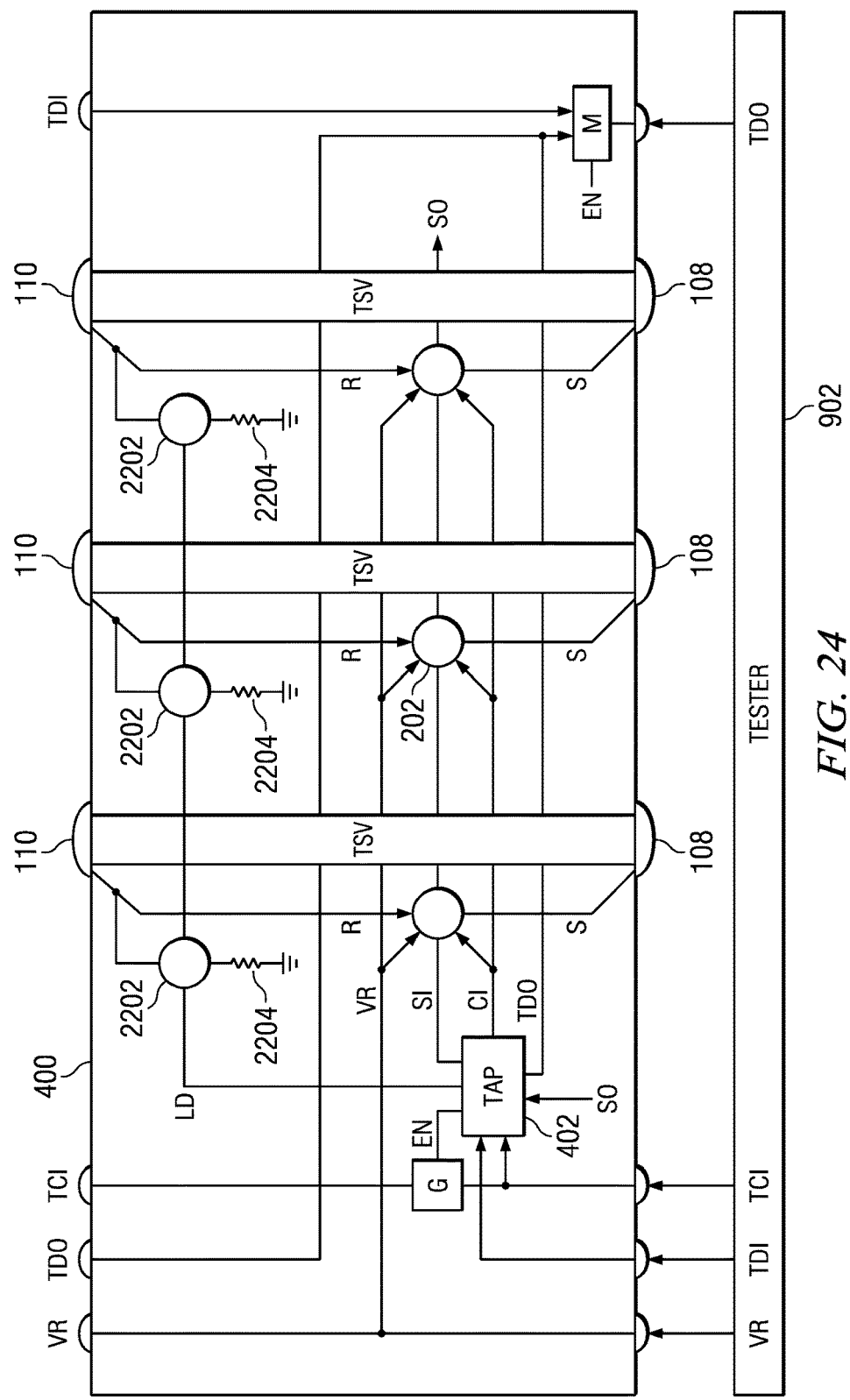
FIG. 24 illustrates the die of FIG. 4 including switchable load resistors on contact points 110, according to the disclosure.

The following FIGS. 22-24 illustrate and describe a solution to this TSV testing problem, according to the disclosure. The solution is based on incorporating switchable load resistors within the die on each contact point 110.

FIG. 22 illustrates the TSV and contact point testing arrangement of FIG. 16 being augmented with a switch 2202 and load resistor 2204. The switch 2202 has a terminal connected to R connection to contact point 110, a terminal connected to a first lead of a load resistor 2204 and a control input terminal connected to a load (LD) control signal. The resistor is designed to a known value of resistance and its second lead is connected to ground. When resistance testing of the TSV and contact points 108 and 110 is being performed, the switch 2202 is closed by the LD control signal to apply the load resistance on contact point 110. Resistance testing is then performed on the TSV and contact points as described previously in FIGS. 12, 13 and 15.

FIG. 23 is provided to illustrate the TSV and contact point testing arrangement of FIG. 18 being augmented with switch 2202 and load resistor 2204 of FIG. 22. In this case the switch is connected to contact point 110 by a connection to terminal 1816 of switch 1804. Resistance testing of TSV and contact points 108 and 110 is performed by closing switch 2202 and performing the resistance test as described in FIGS. 12, 13 and 15.

FIG. 24 illustrates the die 400 of FIG. 12 including switches 2202 and resistors 2204 on contact points 110. The LD control signal to the switches 2202 comes from the TAP 402. The LD control signal can come from the TAP's instruction register as were the SR and SS control signals of FIG. 20, or from a scan cell in series with the TSV scan path as were the SR and SS control signals of FIG. 21. Resistance testing of the TSVs and contact points is the same as described in FIGS. 12 and 13. As seen, the external load resistance probe 1202 of FIG. 12 is not required since the load resistors are integrated into the die 400. Thus the problems mentioned above in using the external load probe 1202 are eliminated.

Figure 25:
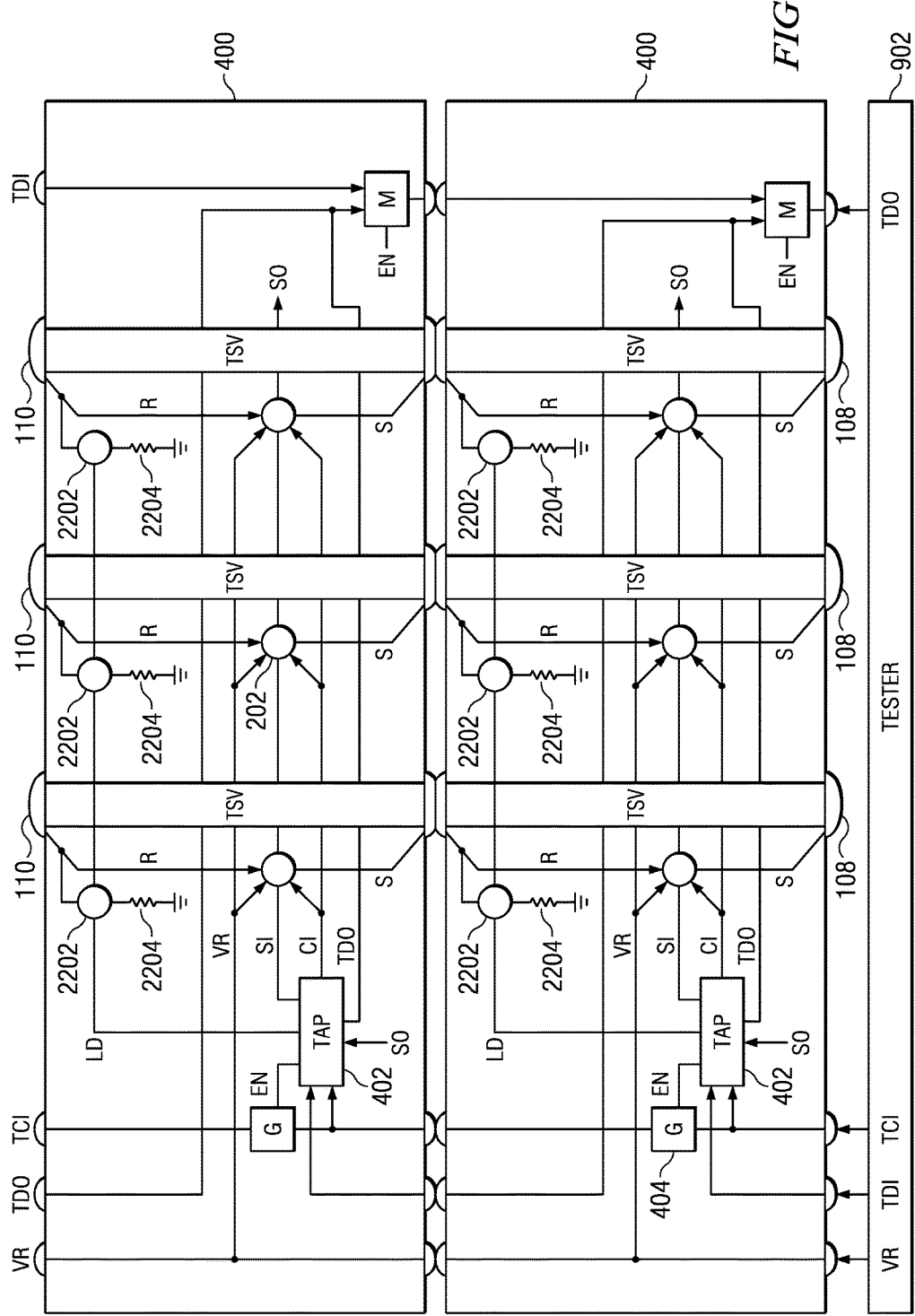
FIG. 25 illustrates the stacked dies of FIG. 15 including switchable load resistors on contact points 110, according to the disclosure.

FIG. 25 illustrates the top and bottom die 400 of FIG. 15 including switches 2202 and resistors 2204 on contact points 110. The LD control signal to the switches 2202 comes from the TAP 402 of each die, as described in FIG. 24. Resistance testing of the series connected TSVs and contact points of the top and bottom die is accomplished by closing the switches 2202 of the top die to place a load resistance on the contact points 110 of the top die and leaving the switches 2202 of the bottom die open, then performing the resistance test as described in FIG. 15. As seen, the external load resistance probe 1202 of FIG. 15 is not required since the integrated load resistors of the top die provide the load for the resistance test. Thus the problems mentioned above in using the external load probe 1202 are eliminated.

Figure 26:
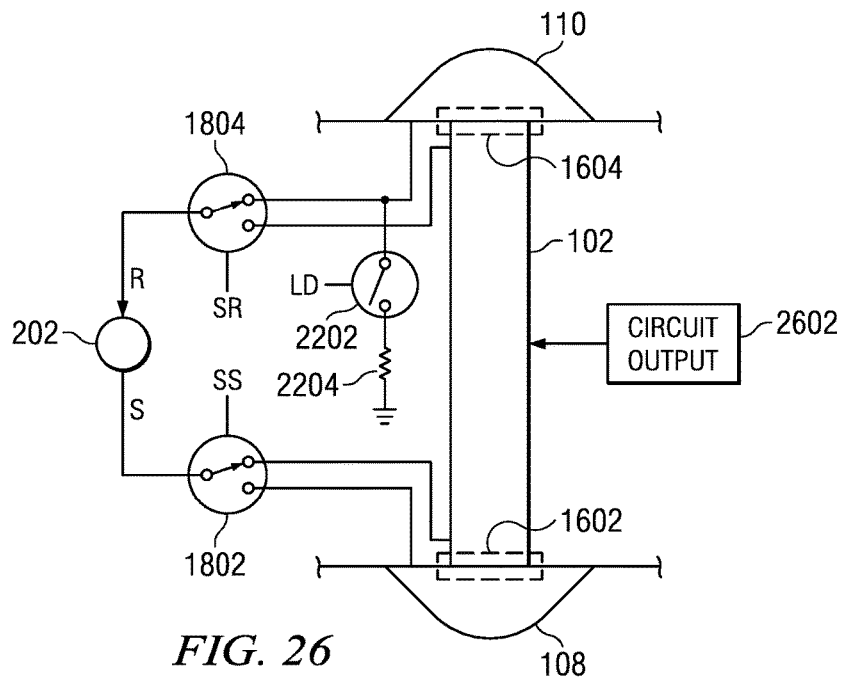
FIG. 26 illustrates a circuit having an output connected to a TSV.

FIG. 26 illustrates the TSV and test circuitry of FIG. 23 wherein an output of a circuit 2602 inside the die connected to the TSV. While this example uses the TSV and test circuitry example of FIG. 23, any of the other TSV and test circuitry examples of FIGS. 16, 17, 18 and 22 may also have an output of a circuit inside the die connected to a TSV as shown in FIG. 26. The circuit 2602 may be a digital or analog circuit. The problem with having a circuit output connected to the TSV is that it may be driving a voltage signal onto the TSV when the scan cell is attempting to test the TSV, which would corrupt the test.

Figure 27:
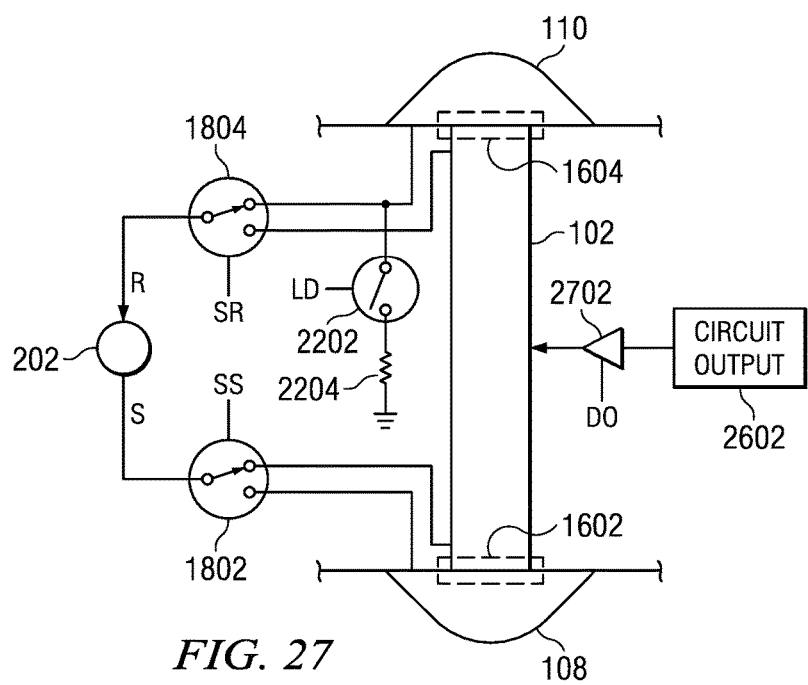
FIG. 27 illustrates an isolation buffer/switch placed in the output path of FIG. 26, according to the disclosure.

FIG. 27 illustrates the TSV and test circuitry of FIG. 26 where a 3-buffer or switch 2702 is inserted, according to the disclosure, into the output path between the circuit 2602 and TSV 102. The buffer/switch 2702 has a disable output (DO) control input that enables or disables the output of circuit 2602. During functional operation of the die, the DO control input is set to enable the output to drive the TSV. During TSV testing, the DO is set to disable the output from driving the TSV, which allows the scan cell 202 to test the TSV as described herein. The DO control signal to the buffer/switch 2702 comes from the TAP 402. The DO control signal can come from the TAP's instruction register as were the SR and SS control signals of FIG. 20, or from a scan cell in series with the TSV scan path as were the SR and SS control signals of FIG. 21.

Figure 28:
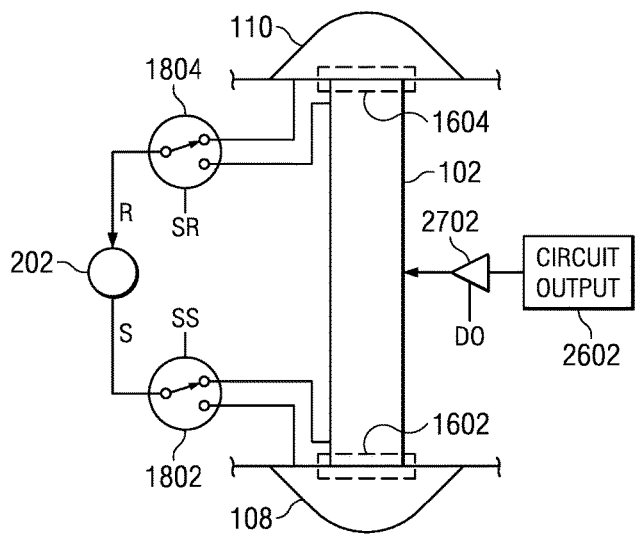
FIG. 28 illustrates an isolation buffer/switch placed in an output path to the TSV of FIG. 18, according to the disclosure.

FIG. 28 illustrates the TSV and test circuitry of FIG. 18 where a 3-buffer or switch 2702 is inserted into the output path between the circuit 2602 and TSV 102, according to the disclosure.

Figure 29:
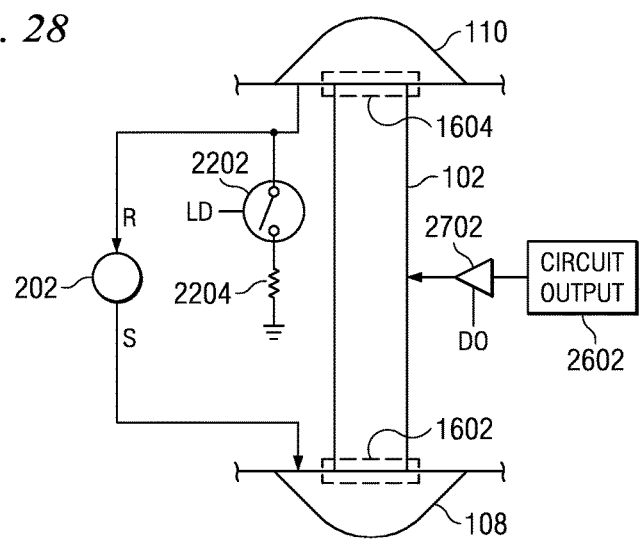
FIG. 29 illustrates an isolation buffer/switch placed in an output path to the TSV of FIG. 22, according to the disclosure.

FIG. 29 illustrates the TSV and test circuitry of FIG. 22 where a 3-buffer or switch 2702 is inserted into the output path between the circuit 2602 and TSV 102, according to the disclosure.

Figure 30:
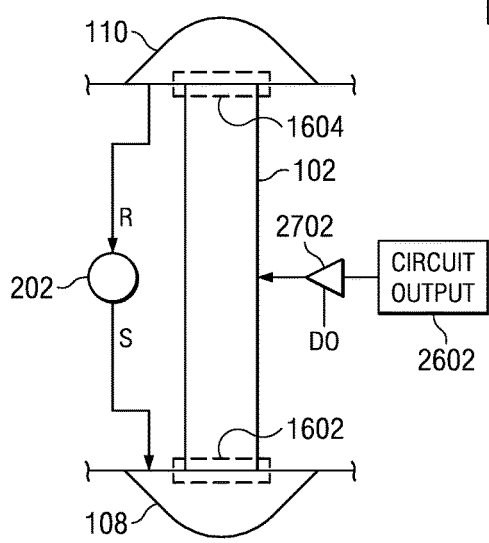
FIG. 30 illustrates an isolation buffer/switch placed in an output path to the TSV of FIG. 16, according to the disclosure.

FIG. 30 illustrates the TSV and test circuitry of FIG. 16 where a 3-buffer or switch 2702 is inserted into the output path between the circuit 2602 and TSV 102, according to the disclosure.

Figure 31:
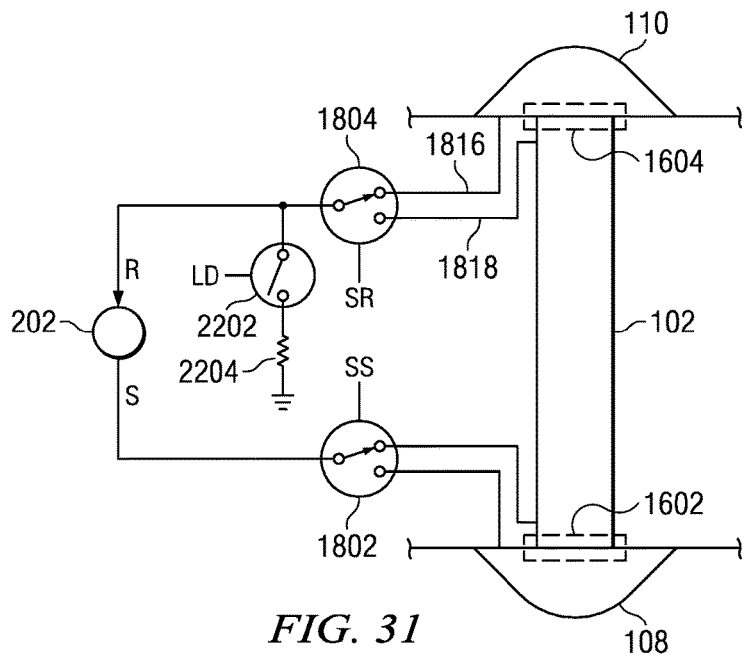
FIG. 31 illustrates the TSV arrangement of FIG. 18 including a switchable load resistor, according to the disclosure.

FIG. 31 illustrates an alternate placement of the switch 2202 and load resistor 2204 of FIG. 23, which allows a load resistance to selectively be placed on either connection 1816 or 1818.

Figure 32:
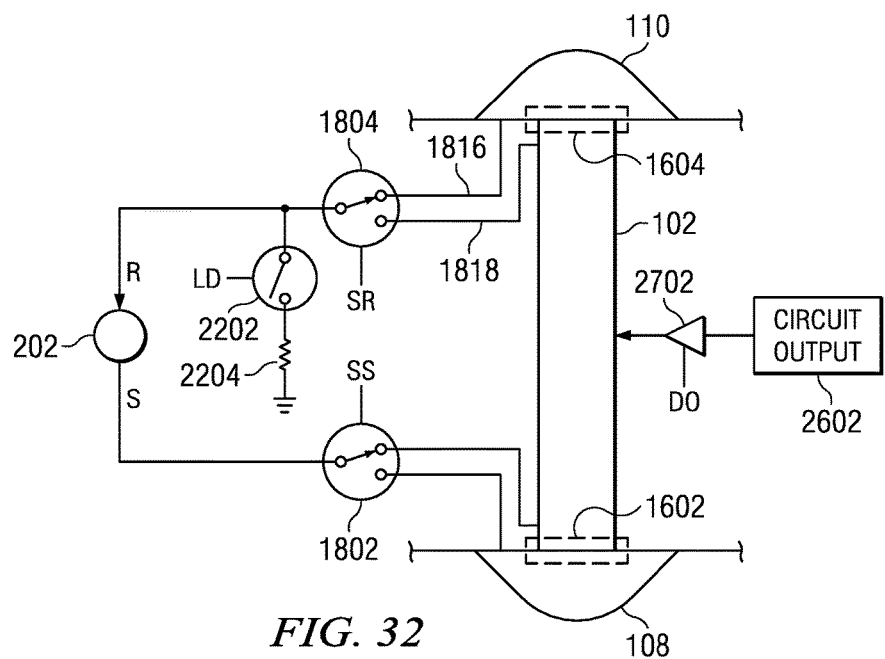
FIG. 32 illustrates an isolation buffer/switch placed in an output path to the TSV of FIG. 31, according to the disclosure.

FIG. 32 illustrates the TSV and test circuitry of FIG. 31 where a 3-state buffer or switch 2702 is inserted into the output path between a circuit 2602 and TSV 102, according to the disclosure.

Although the disclosure has been described in detail, it should be understood that various changes, substitutions and alterations may be made without departing from the spirit and scope of the disclosure as defined by the appended claims.

What is claimed is:

1. An integrated circuit comprising:
  (a) a die with a top surface, a bottom surface, and through substrate vias, each through substrate via is electrically coupled to a contact point on the bottom surface and a contact point on the top surface;
  (b) a scan path coupled to the through substrate vias, the scan path including a scan cell for each through substrate via, each scan cell having a scan input, a scan output, control inputs, a stimulus output coupled to the through substrate via, a response input coupled to the through substrate via, and a reference voltage input;

(c) a test access port controller coupled to the scan path and having control outputs coupled to the control inputs, the test access port controller having a test clock input and a test mode select input.

2. The integrated circuit of claim 1 in which the contact points are metal pads.

3. The integrated circuit of claim 1 in which the scan cells are coupled together in series with the scan output of one scan cell coupled to the scan input of another scan cell.

4. The integrated circuit of claim 1 in which the control inputs of all the scan cells are coupled together.

5. The integrated circuit of claim 1 in which the reference voltage inputs of all the scan cells are coupled together.

6. The integrated circuit of claim 1 including a test clock contact point on the bottom surface of the die coupled to the test clock input, and a test mode select contact point on the bottom surface of the die coupled to the test mode select input.

7. The integrated circuit of claim 1 including a test data in contact point on the bottom surface of the die coupled to the scan input of the first scan cell in the scan path, and a test data out contact point on the bottom surface of the die coupled to the scan output of the last scan cell in the scan path.

8. The integrated circuit of claim 1 including a reference voltage contact point on the bottom surface of the die coupled to the reference voltage inputs of the scan cells.

* * * * *